United States Patent
Wong

(10) Patent No.: US 7,398,379 B1
(45) Date of Patent: Jul. 8, 2008

(54) PROGRAMMABLE LOGIC DEVICE INTEGRATED CIRCUITS WITH WIRELESS PROGRAMMING

(75) Inventor: Brian Yung Fun Wong, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 491 days.

(21) Appl. No.: 11/120,575

(22) Filed: May 2, 2005

(51) Int. Cl.
*G06F 9/445* (2006.01)
*G06F 15/177* (2006.01)

(52) U.S. Cl. .................. 713/1; 713/1; 713/2; 713/100; 326/37; 326/38; 326/39

(58) Field of Classification Search ..................... 713/1, 713/2, 100; 326/37, 38, 39; 438/800
See application file for complete search history.

(56) References Cited

U.S. PATENT DOCUMENTS

| 5,499,017 | A   | * | 3/1996  | Beigel ...................... 340/572.1 |
| 5,894,266 | A   | * | 4/1999  | Wood et al. ............ 340/539.17 |
| 6,373,447 | B1  | * | 4/2002  | Rostoker et al. ............ 343/895 |
| 6,552,694 | B1  | * | 4/2003  | Fujii et al. .................. 343/895 |
| 6,856,291 | B2  | * | 2/2005  | Mickle et al. ................ 343/701 |
| 6,873,842 | B2  | * | 3/2005  | Elayda et al. ............... 455/418 |
| 6,897,788 | B2  | * | 5/2005  | Khair et al. ............ 340/870.16 |
| 6,912,601 | B1  | * | 6/2005  | Moore .......................... 710/10 |
| 7,006,014 | B1  | * | 2/2006  | Henty .......................... 341/22 |
| 7,106,175 | B2  | * | 9/2006  | Lewis ....................... 340/10.34 |
| 7,149,884 | B2  | * | 12/2006 | O'Connor et al. ............... 713/1 |
| 7,226,442 | B2  | * | 6/2007  | Sheppard et al. ......... 604/890.1 |
| 2006/0058076 | A1 | * | 3/2006 | Mickle et al. ................ 455/574 |

OTHER PUBLICATIONS

Hans Eberle, "Radioport: A Radio Network for Monitoring and Diagnosing Computer Systems", Sun Microsystems Inc., pp. 1-11 (Oct. 2002).
Klaus Finkenzeller "RFID Handbook (second edition)" pp. 20 and 21 (c) 2003 John Wiley & Sons.
"Serial Configuration Devices" pp. 1 and 2. Altera Corporation Product data printed from Altera Corporation Website on Feb. 4, 2005.

* cited by examiner

*Primary Examiner*—Nitin C. Patel
(74) *Attorney, Agent, or Firm*—Treyz Law Group; G. Victor Treyz

(57) ABSTRACT

Methods and apparatus are provided for conveying configuration data to a programmable logic device integrated circuit. When the configuration data is loaded into configuration memory on the programmable logic device integrated circuit, the programmable logic device integrated circuit performs custom logic functions. The programmable logic device integrated circuit or an associated configuration device integrated circuit may be provided with power conversion circuitry and transceiver circuitry. The power conversion circuitry converts received radio-frequency signals into power. The power from the power conversion circuitry is provided to the transceiver, loading, and configuration memory circuitry. The transceiver circuitry is connected to an antenna that receives wirelessly-transmitted configuration data and is used to transmit confirmation messages following successful loading of the configuration data into the configuration memory.

16 Claims, 11 Drawing Sheets

PROGRAMMABLE LOGIC DEVICE INTEGRATED CIRCUITS WITH WIRELESS PROGRAMMING

BACKGROUND

This invention relates to programmable logic devices, and more particularly, to wireless programming of programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools use information on the hardware capabilities of a given programmable logic device to help the designer implement the custom logic circuit using the resources available on that given programmable logic device. When the design process is complete, the CAD tools generate configuration data files. The configuration data is loaded into the programmable logic devices to configure them to perform their desired custom logic functions.

Programmable logic devices can be programmed using special equipment called a programmable logic device programmer. In a typical scenario, large numbers of programmable logic devices are programmed with configuration data in an assembly-line fashion. The programmed devices are then installed in a system. Programmable logic devices can be programmed in this way at the original device manufacturer, electronics distributor, or at companies that are manufacturing products that use the programmable logic devices as parts.

Programmable logic devices can also be programmed after they have been installed in a system. For example, a configuration device that is located on the same board as a programmable logic device may be used to load configuration data into the programmable logic device when the board is powered up.

Both assembly-line programming and in-system programming rely on physical contact to form an electrical pathway between the source of configuration data and the programmable logic device. The need for physical contact during assembly-line programming can be burdensome, because it requires the transfer of programmable logic devices between hermetically sealed packages and the device programmer. Often thousands of parts must be handled in this way, which is time-consuming and cumbersome. In-system programming techniques are often not practical. For example, it is generally not possible to reprogram a programmable logic device after it has been installed in product such as a toy, industrial equipment, or a piece of consumer electronics. Physical programming methods also limit the recourses available to end manufacturers if the programmable logic device is accidentally programmed with an incorrect configuration. Often, the manufacturer is faced with the choice of reworking affected material or absorbing the loss.

It would therefore be desirable to provide improved programming processes for programmable logic device integrated circuits.

SUMMARY

Configuration data loading equipment wirelessly transmits programmable logic device integrated circuit configuration data over a wireless communications path. A programmable logic device integrated circuit or configuration device integrated circuit uses one or more antennas to receive the wirelessly-transmitted configuration data, and wirelessly transmit back confirmation of successful configuration.

The integrated circuit to which the configuration data is wirelessly transmitted may have power conversion circuitry and transceiver circuitry including transmitter circuitry and receiver circuitry. The power conversion circuitry receives radio-frequency (RF) signals such as the wirelessly transmitted configuration data signals and converts these RF signals into a direct-current (DC) power supply voltage. The DC power from the power conversion circuitry can be used to power the transceiver, configuration, loading, and memory circuitry. The transceiver circuitry receives the wirelessly-transmitted configuration data. The transmitter circuitry sends back a wirelessly-transmitted confirmation of successful configuration.

The integrated circuit may be a programmable logic device integrated circuit that receives the wirelessly-transmitted configuration data directly and loads the configuration data into configuration memory on the programmable logic device integrated circuit. During operation of the programmable logic device integrated circuit, the programmable logic device integrated circuit performs a custom logic function governed by the loaded configuration data.

The integrated circuit may also be a configuration device integrated circuit that receives the wirelessly-transmitted configuration data and stores it in memory. At an appropriate time such as system power up, loading circuitry on the configuration device may be used to transfer a copy of the stored data from the memory on the configuration device to configuration memory in a programmable logic device integrated circuit.

The power conversion circuitry allows the integrated circuit to be provided with configuration data when the integrated circuit is otherwise unpowered. For example, the integrated circuit can be provided with configuration data while the integrated circuit is in a sealed finished goods container on a manufacturing line, in a sealed finished goods container in storage, or the integrated circuit can be provided with configuration data when installed in a manufactured product.

Further features of the invention, its nature and various advantages will be more apparent from the accompanying drawings and the following detailed description of the preferred embodiments.

DETAILED DESCRIPTION

The present invention relates to programmable logic device integrated circuits and configuration devices for loading configuration data into programmable logic device integrated circuits. The invention also relates to tools and methods for wireless device programming.

Programmable logic devices are integrated circuits that can be configured by a user to perform custom logic functions. Programmable logic devices are configured ("programmed") by loading configuration data into the device. The configuration data selectively turns on and off components of the device's circuitry and thereby customizes the logic on the device. Programmable logic devices with non-volatile configuration memory retain their configuration data when power is removed. Programmable logic devices with volatile configuration data are typically loaded with configuration data on system power-up using an ancillary circuit called a configuration device. The configuration device may store the configuration data using non-volatile memory. Programmable logic devices with non-volatile memory can also be configured after installation in a system (so-called in-system programming).

The present invention may be used in the context of any integrated circuit that has circuitry that can be configured by a user to perform a custom function, but is described in the context of programmable logic devices for clarity.

Figure 1:
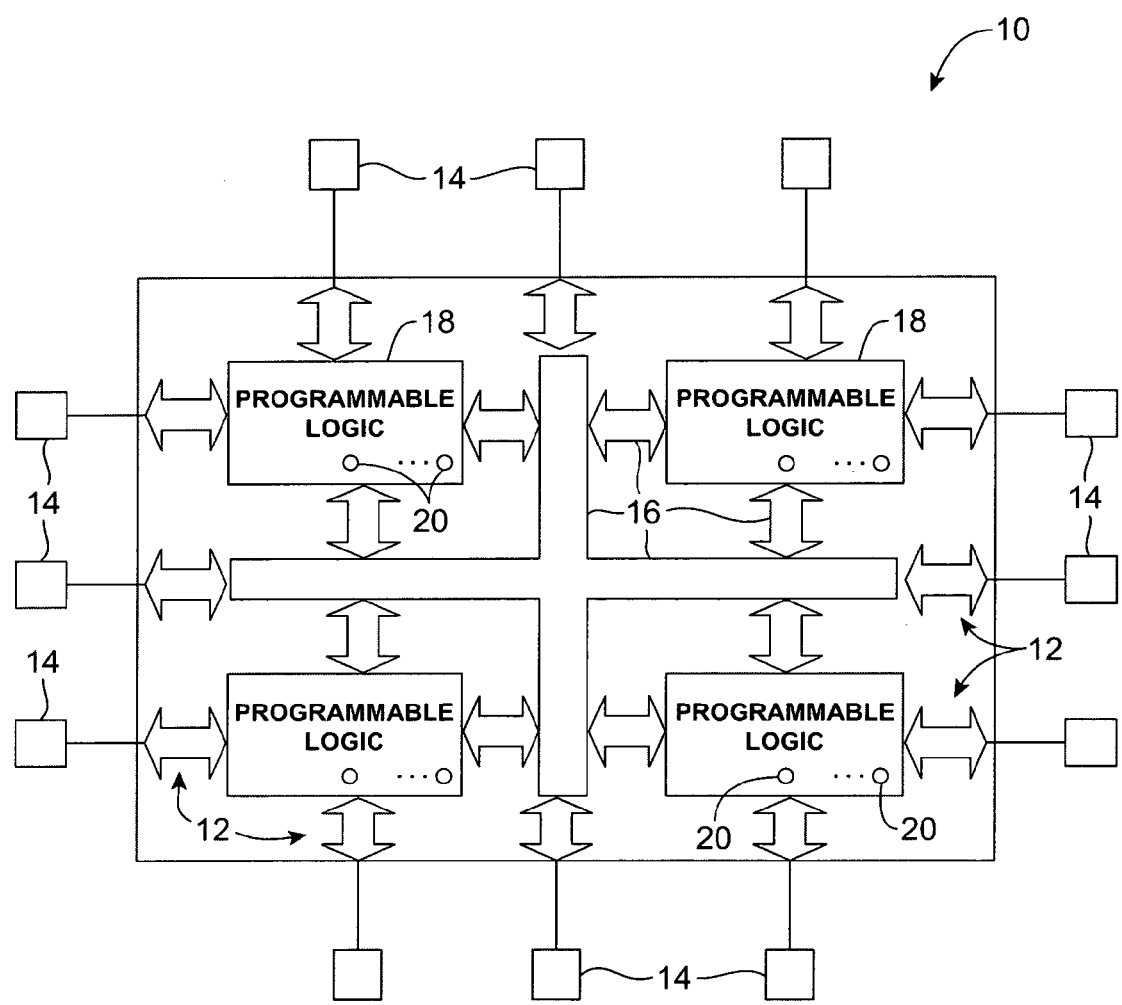
FIG. 1 is a diagram of an illustrative programmable logic device in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements in the programmable logic device 10 using pins 14 and input/output circuitry 12. During normal operation of device 10, the programmable elements (also sometimes called configuration bits or configuration memory) each provide a static control output signal that controls the state of an associated logic component in the programmable logic of circuitry 18.

In a typical volatile arrangement, the programmable elements may be random-access memory (RAM) cells that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured antifuses, programmable logic devices in which elements 20 are formed from electrically-programmable read-only-memory (EPROM) or erasable-electrically-programmable read-only-memory (EEPROM) technology, or programmable logic devices with programmable elements made from magnetic storage elements, or programmable logic devices with programmable elements made from phase-change materials, etc. Illustrative programmable logic elements are shown schematically as elements 20 in FIG. 1.

Regardless of the particular type of programmable element arrangement that is used for device 10, the configuration memory of device 10 is preferably provided with configuration data from a user (e.g., a logic designer). Once provided with appropriate configuration data, the configuration memory will selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired wireless circuitry may be used to receive wirelessly-transmitted configuration data. Other hardwired communications circuitry and digital signal processing circuitry (e.g., multipliers, adders, etc.) may also be used.

In accordance with the present invention, configuration data may be wirelessly provided to programmable logic device 10.

Figure 2:
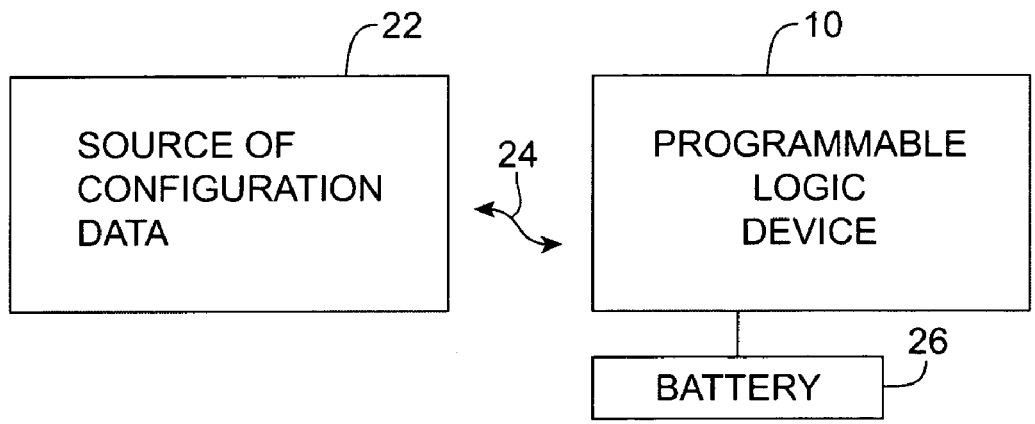
FIG. 2 is a diagram showing how programmable logic device configuration data is loaded wirelessly into a programmable logic device in accordance with the present invention.

With one suitable approach, shown in FIG. 2, configuration data is transmitted wirelessly from a source of configuration data 22 to a programmable logic device 10 over a wireless communications path 24. The wireless communications path 24 may be bidirectional. Use of a bidirectional communications path allows information on the success or failure of programming operations to be transmitted back from the device being programmed to the source of configuration data. This helps ensure that programming operations are performed successfully.

With one suitable approach, once configuration is complete, a suitable confirmation of successful configuration is transmitted back through a wireless communications path 24 to the source 22. The confirmation may include information on the configuration data that has been successfully programmed (e.g., the confirmation may include all of the configuration data), the confirmation may include error flag information relating to errors that have occurred during configuration operations, or the confirmation may include any other suitable information.

Any suitable wireless communications technology may be used for wireless link 24. For example, link 24 may be supported using radio-frequency (RF) transmissions in the range of 0 kHz to 135 Khz, at 6.78 Mhz, at 13.56 Mhz, at 27.125 Mhz, at 2.4 GHz, at 5.8 GHz, or at any other suitable RF frequency. Programmable logic device 10 may contain power conversion circuitry that converts RF power in the incoming wireless signal into a direct-current (DC) power supply voltage for operating circuitry on programmable logic device 10. Programmable logic device may also be powered by a battery 26 or other suitable external power source. The external power source can be connected to the memory, loading circuitry, and other circuitry that would otherwise be powered by the power conversion circuitry. When used, the external power source provides power for the configuration memory to use during configuration data loading operations.

Figure 3:
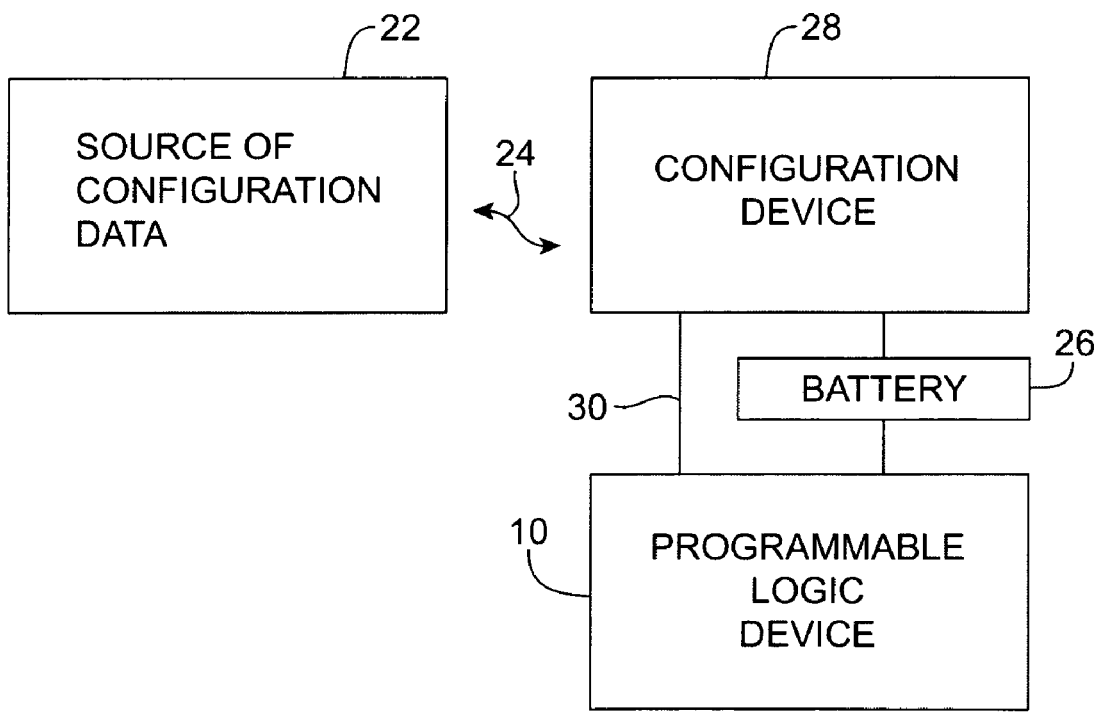
FIG. 3 is a diagram showing how programmable logic device configuration data is loaded wirelessly into a configuration device for loading into a programmable logic device in accordance with the present invention.

With another suitable approach, shown in FIG. 3, configuration data is transmitted wirelessly from a source of configuration data 22 to a configuration device integrated circuit 28 over wireless communications path 24. Device 28 may be powered by a battery 26 or by internal RF power conversion circuitry driven by the RF signal received over link 24. After receiving the configuration data over link 24, configuration device 28 may load the configuration data into programmable logic device 10 over a wired path 30. Once configuration is complete, an optional confirmation of successful configuration may be transmitted back through a wireless communications path 24. In a typical scenario, device 28 and device 10 are integrated circuits mounted on the same circuit board in a system. Configuration device 28 may load the configuration data into device 10 at any suitable time (e.g., at system power-up, etc.). If desired, configuration memory and other circuitry for loading configuration data on programmable logic device 10 may be powered by power from a battery 26 or may be powered by power from configuration device 28 (e.g., power that configuration device 28 has obtained using its RF power conversion circuit). Programmable logic device 10 may also be powered by other sources (e.g., by a power supply trace on a circuit board in a system in which device 10 has been mounted).

The ways in which programmable logic device 10 and configuration device 28 are powered depends on context. In some situations, batteries and other external power sources are not available. Particularly in these situations, programmable logic device 10 and configuration device 28 may use internal RF power conversion circuitry to extract power from RF wireless signals such as those provided by the source of configuration data 22.

To support wireless communications, the source of configuration data 22, the programmable logic device 10, and the configuration device 28 of FIG. 3 include antennas. External antennas (e.g., external thin-film antennas) may be electrically connected to these components or other suitable antenna arrangements can be used. With one suitable approach, programmable logic device 10 and/or configuration device 28 include integral antennas.

Figure 4:
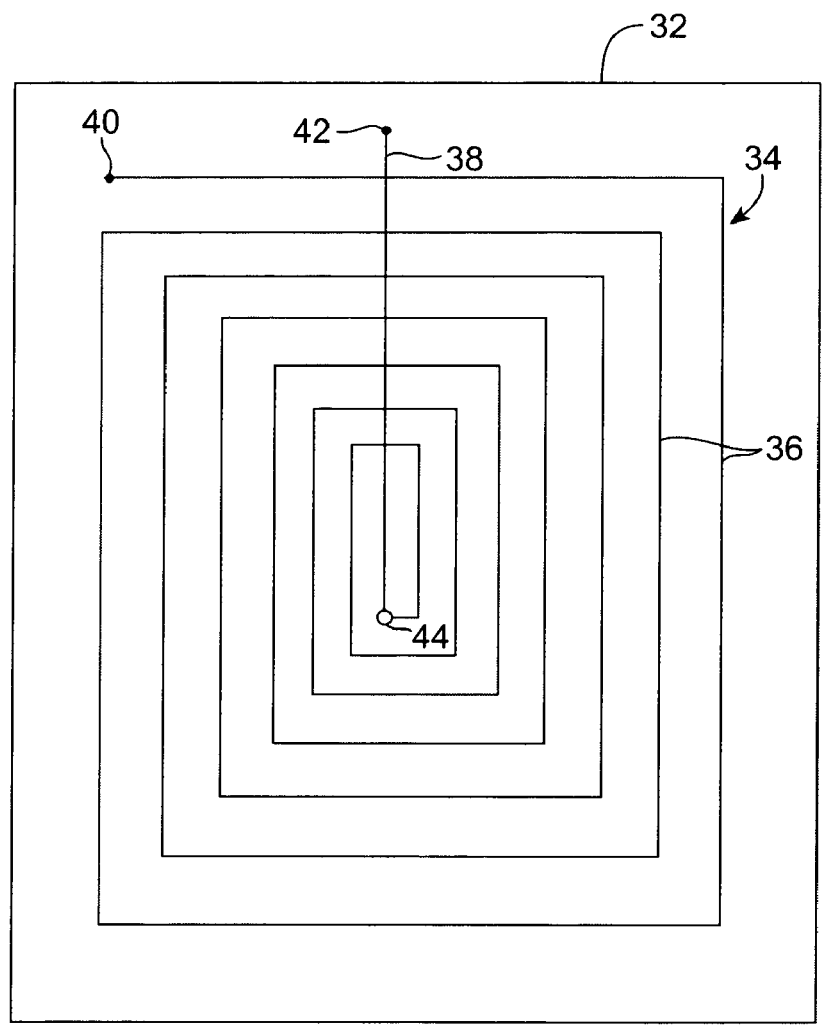
FIG. 4 is a plan view of an illustrative antenna that is formed during integrated circuit manufacturing for a programmable logic device or configuration device integrated circuit in accordance with the present invention.

A top view of an integrated circuit 32 with an integral antenna 34 is shown in FIG. 4. This type of arrangement may be used to provide programmable logic device 10 or configuration device 28 of FIG. 3 with an antenna (i.e., circuit 32 may be a programmable logic device integrated circuit 10 or a configuration device integrated circuit 28). As shown in FIG. 4, antenna 34 may be spiral in shape and may have multiple conductive turns or loops 36. The illustrative antenna 34 of FIG. 4 has seven turns, but this is merely illustrative. In general, antenna 34 may have any suitable number of turns and may use any suitable geometry. The ends of the antenna form terminals 40 and 42, which are electrically connected to circuitry on device 32 (e.g., an RF receiver, RF power conversion circuit, etc.).

When a spiral antenna configuration of the type shown in FIG. 4 is used, the loops 36 may be formed in one metal layer on top of circuit 32 and the conductor 38 may be formed in another metal layer. The two metal layers can be separated by a dielectric layer (insulator). A conductive via 44 may be used to electrically connect conductor 38 to the innermost point of the spiral formed by loops 36. The dielectric layer between the two metal layers prevents current from flowing between conductor 38 and loops 36 except at via 44.

Integrated circuit 32 may have many metal and dielectric layers in its dielectric stack. In a typical semiconductor fabrication process, there are about eight layers of metal. If this type of fabrication process is used to form antenna 34, loops 36 may be formed in metal layer 7 (M7) and conductor 38 may be formed in metal layer 8 (M8). With this arrangement, the antenna is formed from metal in the top metal layer (M8) and the second-to-top metal layer (M7). This is merely one illustrative arrangement that may be used for fabricating antenna 34 as part of an integrated circuit 32. Any suitable arrangement may be used if desired.

Figure 5:
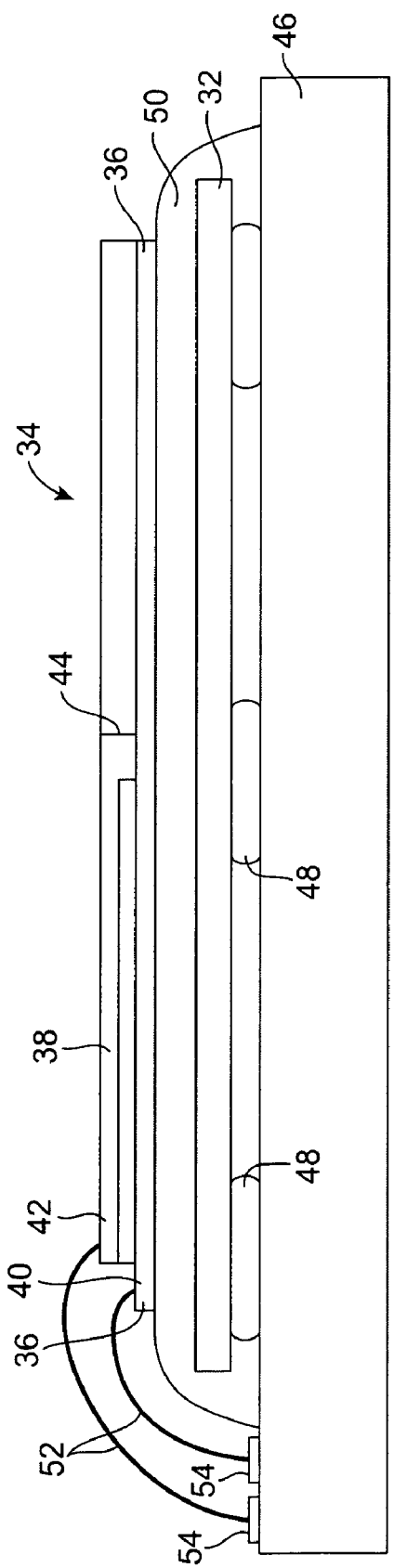
FIG. 5 is a side view of an illustrative antenna formed on a solder-ball mounted programmable logic device integrated circuit or configuration device integrated circuit in accordance with the present invention.

As shown in FIG. 5, an antenna 34 may be formed on top of a backfill layer used during packaging integrated circuit 32. In the example of FIG. 5, integrated circuit 32 is mounted upside down to a package 46. Solder balls 48 are used to connect pads on integrated circuit 32 to mating pads on package 46. After integrated circuit 32 has been mounted to package 46, epoxy or other suitable backfill 50 is used to cover integrated circuit 32, as shown in FIG. 5. The loops 36 of antenna 34 may be formed on the backfill 50. Wirebond wires 52 are used to connect terminals 40 and 42 of antenna 34 to pads 54 on package 46.

Figure 6:
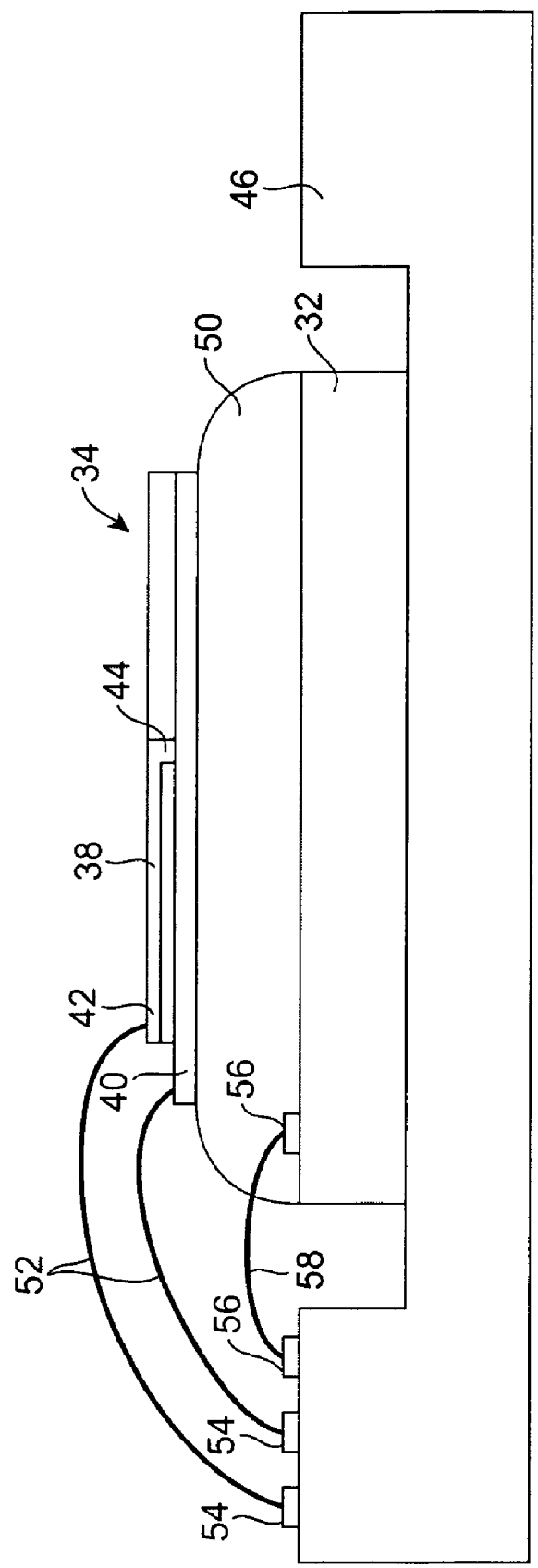
FIG. 6 is a side view of an illustrative antenna formed on a wire-bonded programmable logic device integrated circuit or configuration device integrated circuit in accordance with the present invention.

Another suitable arrangement is shown in FIG. 6. In the configuration of FIG. 6, integrated circuit 32 is mounted right side up on package 46. Wirebond wires 52 are used to connect terminals 40 and 42 to pads 54 on package 46. Pads such as pads 56 and wire-bond wires such as wire 58 are used to make electrical connections between the circuitry of integrated circuit 32 and package 46.

In the arrangements of FIGS. 5 and 6, package 46 preferably contains conductive pathways that connect the antenna terminals to circuitry in circuit 32.

The RF signals that are received at the integrated circuit 32 (i.e., programmable logic device integrated circuit 10 or configuration device 28) are converted into data signals (configuration data). To support integrated circuits 32 that are not powered by a battery or other suitable external source of power, integrated circuits 32 may be provided with RF power conversion circuits. The RF power conversion circuits transform RF signal energy into a DC power supply voltage that can be used to power other circuitry on the integrated circuit 32. The inclusion of a power conversion circuit in the programmable logic device integrated circuit 10 or configuration device integrated circuit 28 allows the circuitry in these devices to be used in environments in which no other source of power is available. For example, power from the RF power conversion circuitry can be used to power an integrated circuit that is contained in a hermetically-sealed finished goods container or that is installed in a consumer electronics item, industrial equipment, toy, or other manufactured product that does not have non-wireless capabilities for receiving configuration data.

Any suitable RF power conversion circuitry can be used to produce power in the programmable logic device 10 and configuration device 28. Moreover, either a single-antenna arrangement or a dual-antenna arrangement may be used to receive the RF signals from wireless path 24.

Figure 7:
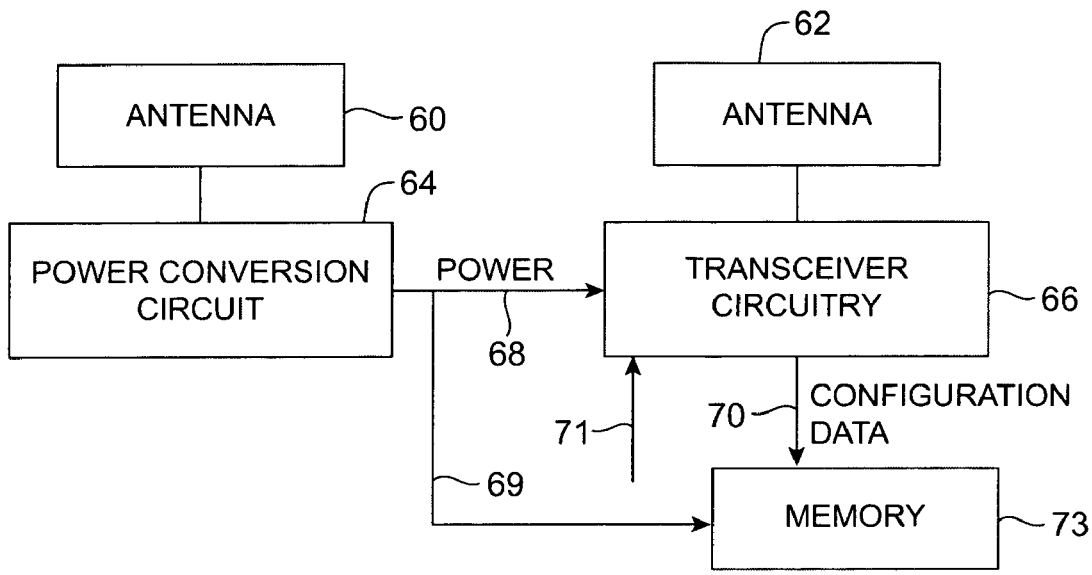
FIG. 7 is a diagram of a dual antenna configuration that may be used for the wireless programmable logic device or configuration device integrated circuit in accordance with the present invention.

A dual-antenna arrangement is shown in FIG. 7. As shown in FIG. 7, one antenna 60 may be dedicated to providing RF signals to a power conversion circuit 64, whereas another antenna 62 may be used to provide RF signals to receiver circuitry in transceiver 66. The power conversion circuit 64 extracts power from the received RF signals and provides the extracted power to transceiver circuitry 66 via power path 68. The power provided to transceiver circuitry 66 powers circuitry 66 so that circuitry 66 can convert the RF signals received over wireless path 24 (FIGS. 2 and 3) into configuration data signals to provide at output 70. The power is also provided to the memory 73 (i.e., configuration memory in a programmable logic device or memory in a configuration device) through power path 69 in order to activate the memory to receive configuration data. The power is also used to power transmitter circuitry in transceiver 66 so that transceiver 66 may transmit a confirmation of successful configuration data programming to the source of configuration data 22. As shown schematically by line 71, following successful programming, a confirmation copy of the configuration data may be provided back to the transceiver circuitry 66, for transmitting as part of the confirmation message through antenna 62.

The antennas 60 and 62 may be provided using any suitable arrangement. For example, each antenna can be provided using a spiral arrangement such as those described in connection with FIGS. 4-6. Antennas 60 and 62 may be stacked on top of each other on backfill 50, or may be stacked on top of each other in a dielectric stack, or nested together (e.g., antenna 60 may be formed using metal layers 5 and 6 and antenna 62 may be formed using metal layers 7 and 8). If desired, antennas 60 and 62 may be nested together such that loop 36 from antenna 60 is separated from loop 36 from antenna 62, but both are formed on metal layer 8, while the conductor 38 for antenna 60 and the conductor 38 for antenna 62 are formed on metal layer 7.

When dual antennas are used, each antenna and its accompanying circuitry may be optimized for satisfying its intended purpose. For example, antenna 60 and power conversion circuit 64 can be optimized to efficiently extract RF energy from the wireless signals in path 24 that are transmitted from the source of configuration data 22 (see, e.g., FIGS. 2 and 3). Antenna 62 and transceiver circuitry 66 can be optimized to extract configuration data from the transmitted RF signals, and relay back a configuration confirmation to the source of configuration data 22.

Figure 8:
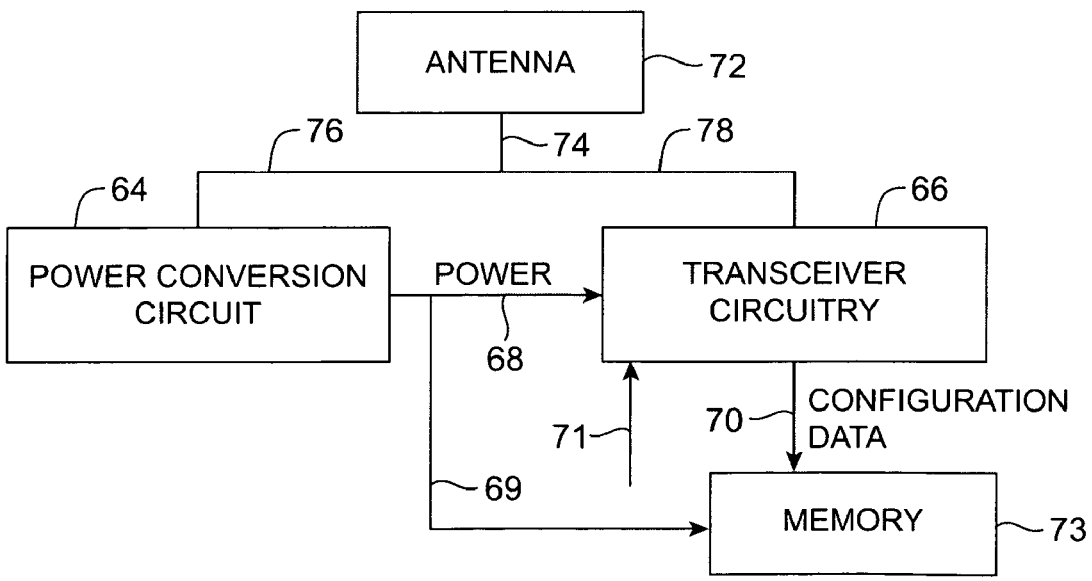
FIG. 8 is a diagram of a single-antenna configuration that may be used for the wireless programmable logic device or configuration device integrated circuit in accordance with the present invention.

A single-antenna arrangement is shown in FIG. 8. With this type of configuration, RF signals that are transmitted from the source of configuration data 22 over path 24 (FIGS. 2 and 3) are split into two parts. Path 74 has one branch 76 to convey received RF signals to power conversion circuit 64 and another branch 78 to convey received and transmitted RF signals to transceiver circuitry 66. Power conversion circuitry 64 converts the signals from path 76 into DC power and provides this power to transceiver circuitry 66 over path 68. The power is also provided to the memory 73 (i.e., programmable logic device configuration memory or memory on a configuration device) through power path 69 in order to activate the memory to receive configuration data. Transceiver circuitry 66 receives the RF signals from path 78 and converts the RF signals into digital configuration data to provide to output 70. Configuration confirmation data input 71 may be used to receive confirmation information following programming operations. The confirmation information may include a copy of the successfully programmed configuration data, may include error flags, or may include any other suitable information for inclusion in a confirmation message. The transceiver circuitry 66 receives the confirmation message, converts the information in the confirmation message into RF signals and sends the RF signals through path 78 to antenna 72.

In general, the wireless paths 24 between sources 22 and programmable logic devices 10 may be bidirectional wireless paths or unidirectional paths. When paths 24 are bidirectional paths, transmitter circuitry in transceiver circuitry 66 may be used to transmit confirmation signals and other signals through antennas 62 and 72. A unidirectional path arrangement avoids the need for transmitter circuitry, but a bidirectional path allows for more robust communications. For example, bidirectional communications schemes allow for sophisticated error correction techniques (e.g., cyclic redundancy checking or configuration verification) to be used to ensure data integrity. If desired, communications over the wireless link 24 may be encrypted to prevent unauthorized interception of the configuration data.

Figure 9:
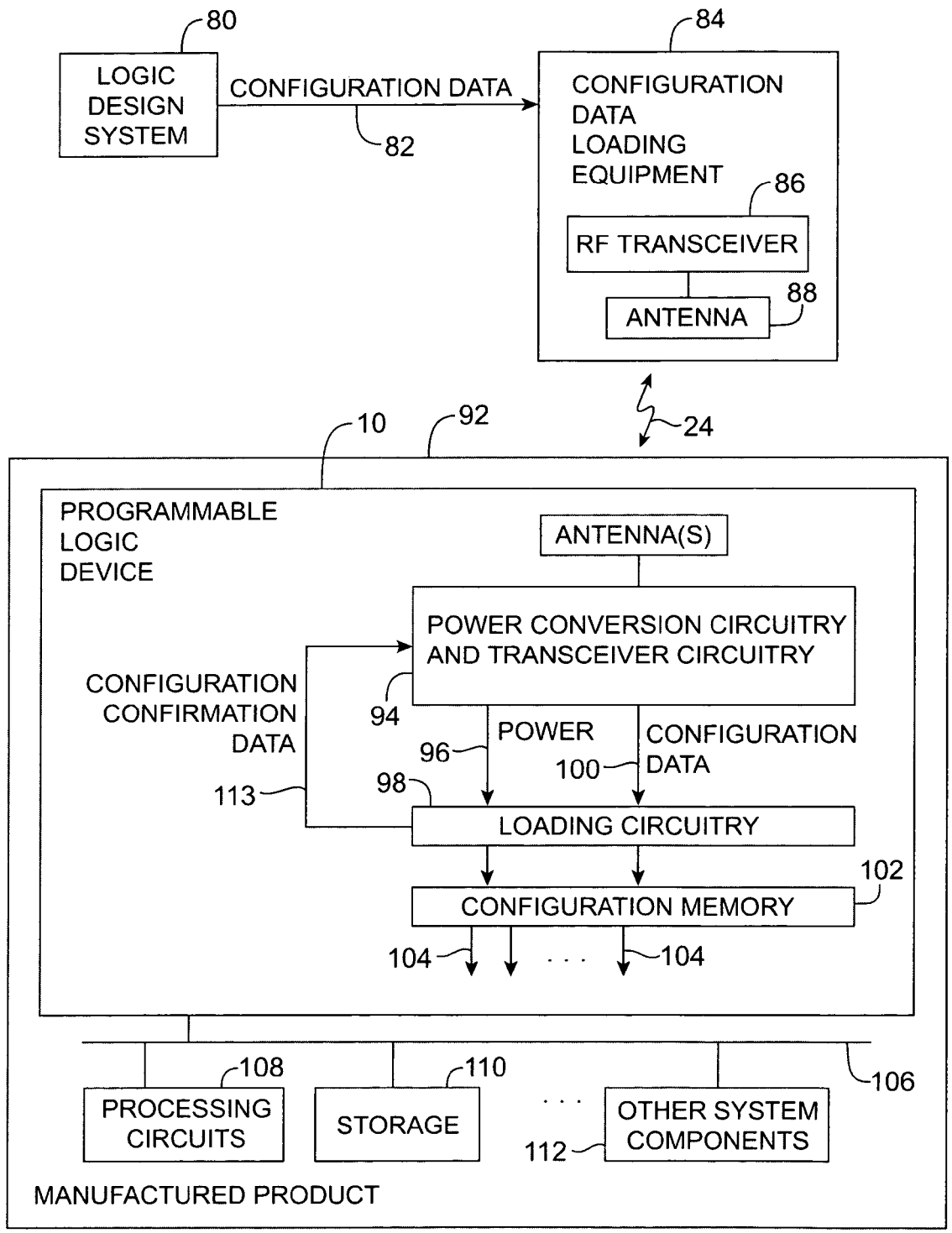
FIG. 9 is a diagram showing how configuration data is wirelessly loaded into a programmable logic device integrated circuit in accordance with the present invention.

An illustrative system environment in which a programmable logic device integrated circuit is programmed wirelessly is shown in FIG. 9. As shown in FIG. 9, configuration data is initially produced using CAD tools in a logic design system 80. The configuration data produced by logic design system 80 is provided to configuration data loading equipment 84 over an electronic communications path 82, by transferring the configuration data on a storage medium, etc.

The configuration data loading equipment 84 (also sometimes called a programmable logic device integrated circuit "programmer") has an RF transceiver 86. Transceiver 86 includes an RF transmitter and optionally includes an RF receiver (if bidirectional wireless communications are supported). Programmer 84 also has an antenna 88 connected to transceiver 86.

Configuration data for programmable logic device integrated circuit 10 is transmitted wirelessly through antenna 88 over wireless link 24. Programmable logic device 10 includes one or more antennas 90 for receiving RF signals from configuration data loading equipment 84.

In the example of FIG. 9, programmable logic device integrated circuit 10 is shown as being installed in a manufactured product 92. This is merely illustrative. In general, programmable logic device integrated circuit 10 need not be installed in a manufactured product to be programmed.

The RF signals received via antenna 90 are provided to power conversion circuitry and transceiver circuitry 94. Transceiver circuitry 94 includes receiver circuitry and, if bidirectional communications over path 24 are supported, includes transmitter circuitry. The power conversion circuitry 94 converts the received RF signals into DC power. The DC power is provided to the receiver circuitry and to the loading circuit 98 over path 96. The transceiver circuitry 94 converts the received RF signals into digital data signals. Configuration data transmitted from configuration data loading equipment 84 is provided to loading circuitry 98 via data path 100.

Loading circuitry 98 receives the configuration data from receiver circuitry 94 and loads the received configuration data into configuration memory 102. Following loading, confirmation of successful configuration data loading is relayed back to transceiver 94 through path 113. Configuration memory 102 may be loaded using any suitable technique. For example, registers in configuration memory 102 may be connected to form a chain and configuration data may be serially loaded into the chain by loading circuitry 98 (e.g., by applying suitable clock and enable signals to the registers). The loaded configuration data produces static control signals at outputs 104 that configure programmable logic 18 (FIG. 1).

If programmable logic device 10 is installed in a manufactured product, device 10 may communicate with other electrical components in the product over communication paths 106 (e.g., signal and power busses). Components in a typical manufactured product include processing circuits 108 (e.g., digital signal processors, application specific integrated circuits, microprocessors, custom logic, etc.), storage 110 (e.g., hard disk drives, memory, etc.), and other system components 112. Often programmable logic device 10 will be installed in a manufactured product 92 such as a toy or other item that does not have any non-wireless capacity to receive configuration data. The only way in which to program device 10 (e.g., to program device 10 for the first time or to reprogram device 10 for an update) is to transmit configuration data to device 10 wirelessly over wireless path 24.

If product 92 does not have (or cannot be assured of having) a battery or other source of power, programmable logic device 10 may be based on non-volatile memory technology. Configuration memory 102 in this type of arrangement may be, for example, EEPROM or flash-based configuration memory. The power for programming the configuration data into configuration memory 102 with loading circuitry 98 is extracted from the RF signals transmitted over link 24 by the power conversion circuitry 94. The extracted power may be used to power configuration memory and other circuitry used during loading operations. If battery power is available, programmable logic device 10 may include battery-backed volatile configuration memory 102.

Figure 10:
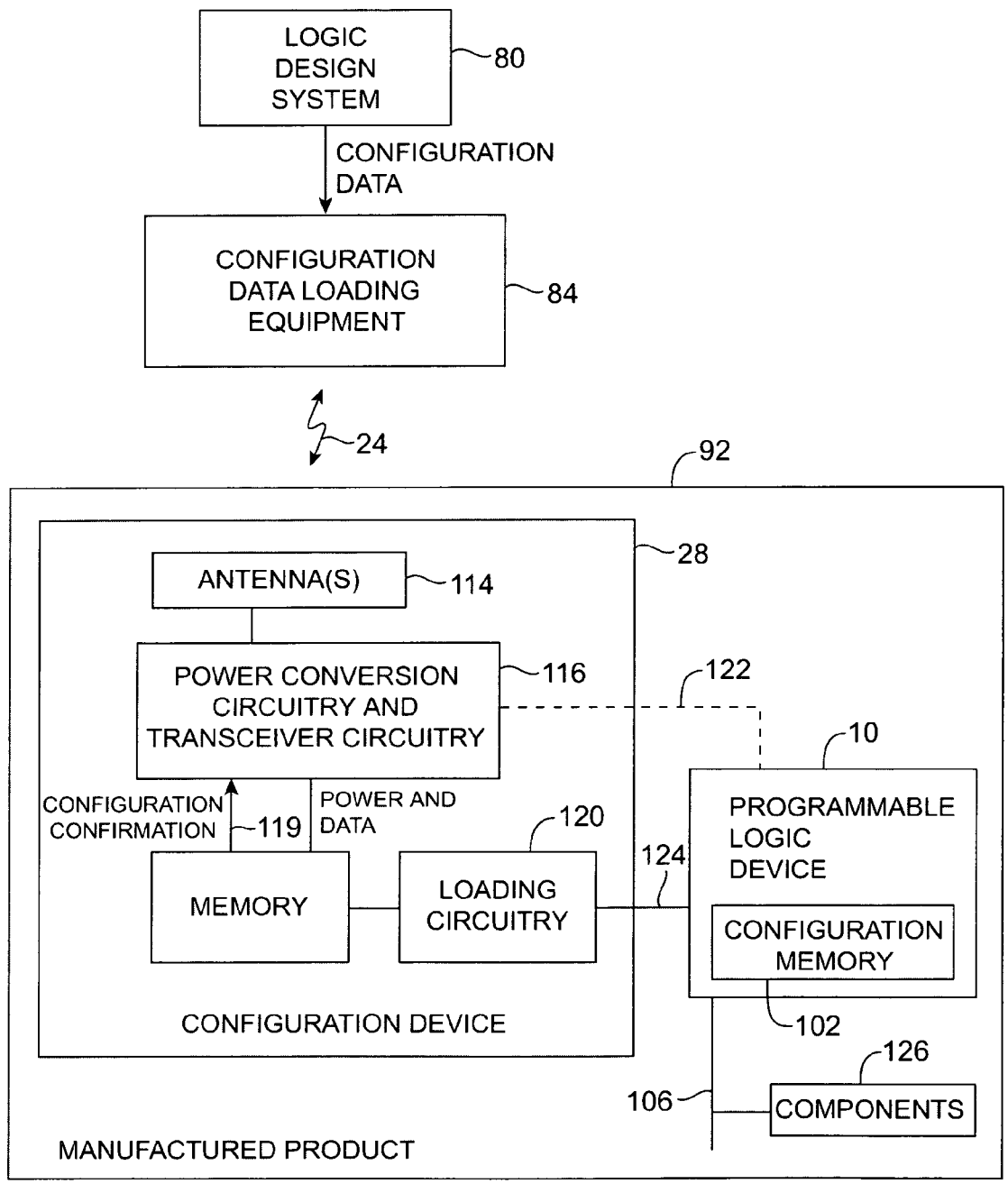
FIG. 10 is a diagram showing how configuration data is wirelessly provided to a configuration device that loads the configuration data into a programmable logic device in accordance with the present invention.

An illustrative arrangement in which configuration data is wirelessly loaded into programmable logic device 10 using a configuration device 28 is shown in FIG. 10. As shown in FIG. 10, logic design system 80 provides configuration data to configuration data loading equipment 84. Equipment 84 wirelessly transmits the configuration data to configuration device 28 over wireless path 24.

Configuration device 28 may or may not be installed in a system when the configuration data is transmitted. In the example of FIG. 10, configuration device 28 is shown as being installed in a manufactured product 92. This is merely an illustrative arrangement. Configuration device 28 may also be provided with configuration data during the manufacturing process before device 28 has been installed in a circuit board.

The configuration device integrated circuit 28 has one or more antennas 114 for receiving the transmitted RF signals from path 24. The received RF signals are provided to power conversion circuitry and receiver circuitry in transceiver 116. (Transmitter circuitry can also be provided in transceiver circuitry 116 of FIG. 10 and circuitry 94 of FIG. 9 if bidirectional wireless communications are supported over path 24.) When circuitry 116 contains a transmitter, confirmation of successful configuration may be relayed back to transceiver 116 through path 119 for transmission to configuration data loading equipment 84 over path 24. The power conversion circuitry produces DC power that is used to power circuit 28 and which may be used to power programmable logic device 10 if desired. The optional distribution of power from power conversion circuitry and receiver circuitry 116 to programmable logic device integrated circuit 10 is shown schematically in FIG. 10 by dotted line 122.

Configuration device 28 has a configuration data loading circuit 120 that is connected to programmable logic device 10 over a wired communications path 124. The receiver circuitry in circuit 116 converts the received RF signals into digital configuration data. The configuration data is stored in memory 118. If desired, memory 118 may be non-volatile memory such as EPROM or flash memory. With this type of approach, subsequent operations involved in transferring the configuration data from memory 118 to programmable logic device 10 may be performed by loading circuitry 120 after a battery or other power source has been used to supply power to product 92 (e.g., at system power-up). Other configurations are also possible. For example, configuration memory 102 in programmable logic device 10 may be non-volatile memory that is loaded with the configuration data from memory 118 by loading circuitry 120.

In a manufactured product 92, programmable logic device 10 typically interacts with other system components 126 over paths 106. During normal system operations, programmable logic device 10 performs the custom logic functions dictated by the loaded configuration data in configuration memory 102. Configuration device 28 is generally not used except during configuration data loading operations (e.g., upon system power up or whenever an update to the configuration data in memory 102 is desired).

When the programmable logic device integrated circuit 10 or configuration device integrated circuit 28 includes power conversion circuitry, the device 10 or 28 is able to receive the configuration data from the programmer 84, even when the device 10 or 28 is not installed in a system or otherwise provided with external power. An advantage of this type of arrangement is that it allows configuration data to be loaded into the device 10 or 28 during the manufacturing process (e.g., at the original device manufacturer, programmable logic device sales distributor, or at a customer of the manufacturer's).

After initial semiconductor fabrication operations have been completed and devices 10 or 28 have been tested to detect and correct repairable defects, devices 10 and 28 are typically held in inventory. Even if the holding time for the devices is short, care must be taken during handling to avoid damage to the devices (e.g., from electrostatic discharge, etc.). In a typical manufacturing environment, thousands, tens of thousands, or hundreds of thousands of devices are loaded into trays.

Figure 11:
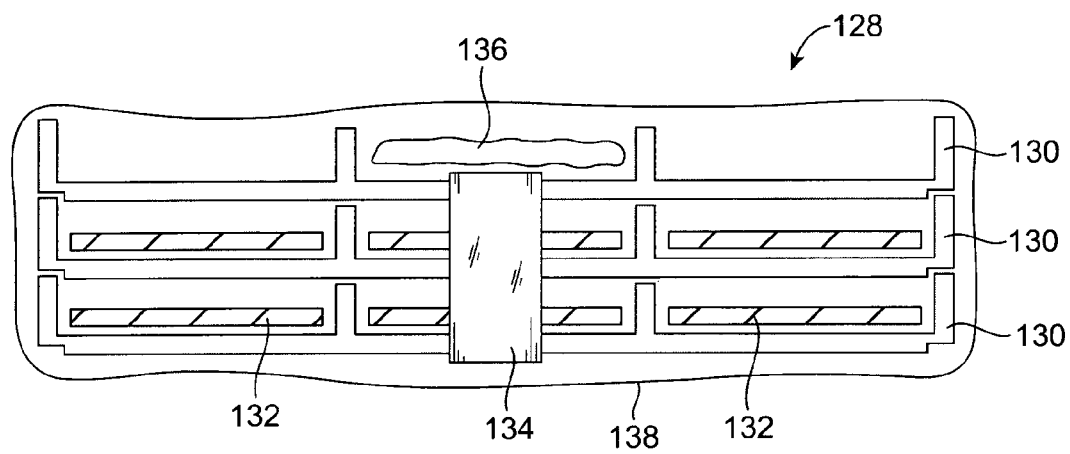
FIG. 11 is a side view of an illustrative finished goods container arrangement that may be used to hold programmable logic device integrated circuits or configuration devices during wireless data loading activities in accordance with the present invention.

The trays are formed of plastic and are non-conductive. A typical tray may hold tens or hundreds of integrated circuit die or packaged circuits. The trays are generally stackable. A typical stack may contain one to twenty trays. An illustrative stack 128 containing three circuit holding trays 130 is shown in FIG. 11. After the trays have been placed in a stack, a strap 134 is used to hold the trays together. As shown in FIG. 11, the uppermost tray 130 can serve as a lid for the stack. Desiccant 136 may be placed in the top tray 130 to reduce moisture.

At this stage, the trays are generally heated to drive off excess water vapor. Following heating, the trays are placed in an ESD (electrostatic discharge) plastic bag 138 and vacuum sealed, as shown in FIG. 11. The bagged trays may then be stored in a cardboard box. Foam packaging materials may be used to ensure that the devices are not damaged during storage in the box. When the devices are stored using a tray-based arrangement of the type shown in FIG. 11 or other suitable storage arrangement, the devices are said to be stored in "finished goods containers."

The process of storing devices 10 and 28 in the finished goods containers is time consuming and requires careful handling to avoid circuit damage. With conventional programming techniques, if a manufacturer receives a request to program 10,000 devices (as an example), workers at the manufacturer must carefully unwrap the finished goods containers and transfer each device into a programmer. Following programming, the devices must be reloaded into the finished goods containers using the time-consuming process described above. With the present invention, devices can be programmed while still in the finished goods containers, because the power conversion circuitry in the devices provides an internal source of power for operating the receiver needed to receive the wirelessly transmitted configuration data from the programmer. The present invention also allows manufactured goods that do not have suitable non-wireless configuration data loading mechanisms available to be wirelessly programmed (i.e., following initial assembly or later, to program new features into an existing product as an update).

Figure 12:
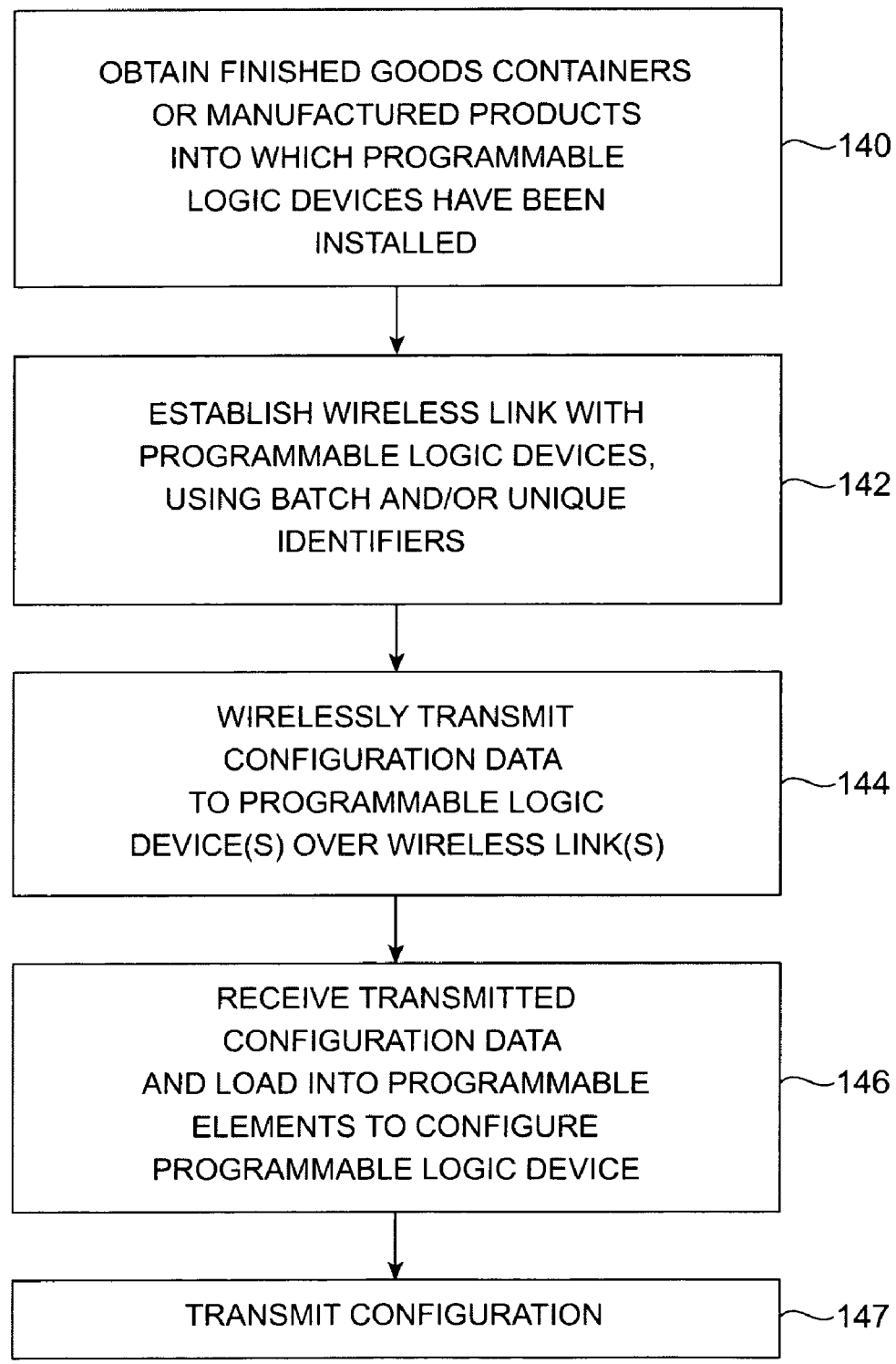
FIG. 12 is a flow chart of illustrative steps involved in wirelessly programming a programmable logic device integrated circuit with configuration data in accordance with the present invention.

Illustrative steps involved in wirelessly loading configuration data into a programmable logic device 10 while the device 10 is in a finished goods container or a manufactured product are shown in FIG. 12.

At step 140, the finished goods containers containing the devices 10 or the manufactured products containing the devices 10 are obtained.

At step 142, the configuration data loading equipment 84 of FIG. 9 establishes a wireless link 24 with device 10. The link 24 may be unidirectional or bidirectional. To adequately address devices 10, an addressing system may be used in which each programmable logic device 10 is assigned a unique code. The code may be any suitable alphanumeric code and may be programmed into device 10 during testing (as an example) for addressing, manufacturer ID, and security purposes. Part of the code (e.g., a prefix portion) may be a batch address that can be used to address 100s, 1000s, 10,000s or more devices 10 in parallel during manufacturing, thereby increasing throughput. The batch and/or unique addresses of the devices 10 may be used at step 142 (establishing the link) and at subsequent steps (e.g., during configuration data transmission).

At step 144, the configuration data loading equipment 84 wirelessly transmits the configuration data to the programmable logic device 10 over wireless path 24. If batch addressing is used, the configuration data may be transmitted to all of the programmable logic devices 10 with the same batch address. This allows numerous programmable logic devices 10 to be programmed in parallel.

At step 146, the configuration data that was transmitted by the configuration data loading equipment 84 (i.e., the device programmer) is received by the programmable logic device (s) and is loaded into the configuration memory 102 (FIG. 9).

At step 147, the programmable logic device may transmit confirmation of successful programming (e.g., by sending a configuration read back message containing the programmed configuration data to the configuration data loading equipment 84 or by signaling through an error flag). If desired, the transmission of confirmation signals may be a user-adjustable option. In environments in which link 24 supports unidirectional communications, no confirmation is provided.

Figure 13:
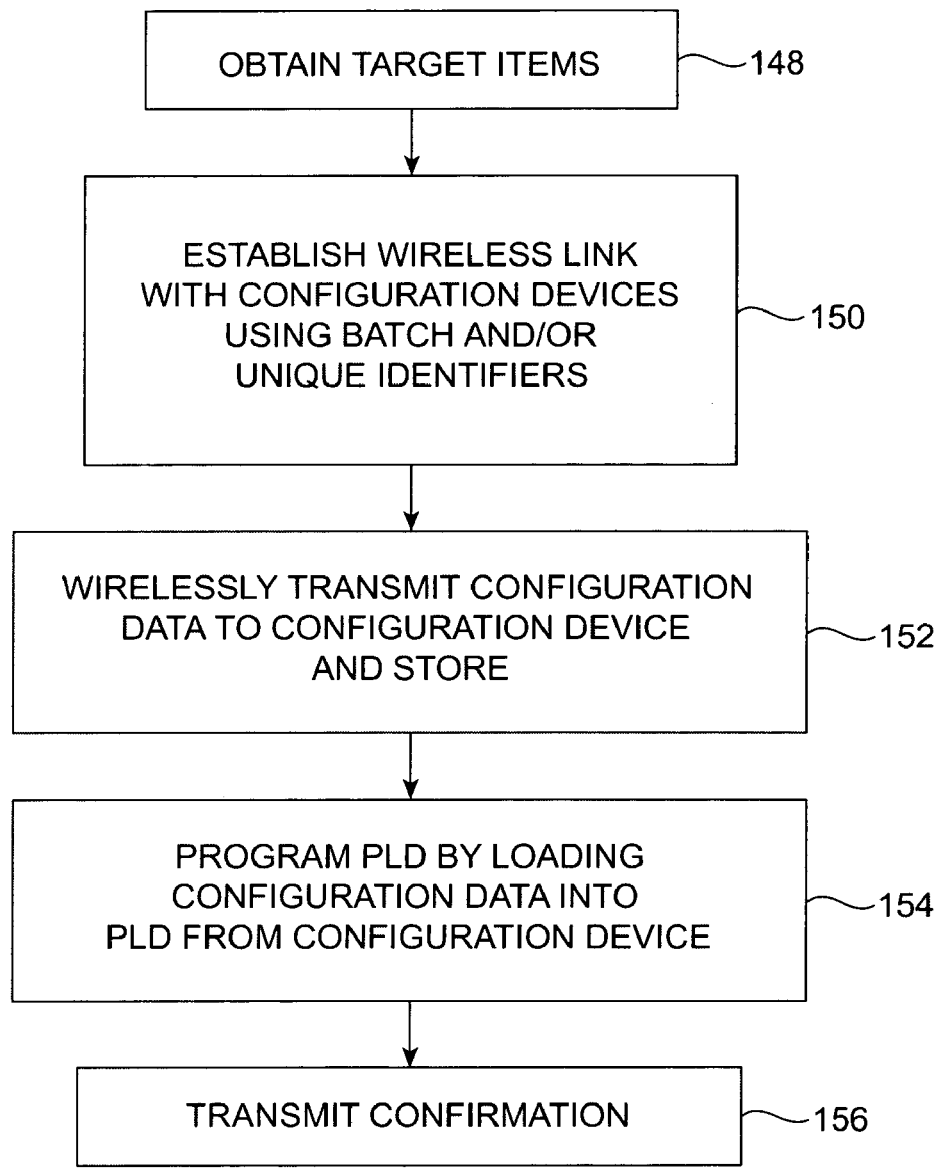
FIG. 13 is a flow chart of illustrative steps involved in wirelessly providing configuration data to a configuration device that loads the configuration data into a programmable logic device integrated circuit in accordance with the present invention.

Illustrative steps involved in wirelessly loading configuration data into a configuration device 28 while the device 28 is in a finished goods container or a manufactured product are shown in FIG. 13.

At step 148, the finished goods containers containing the devices 28 or the manufactured products containing the devices 28 are obtained. When the devices 28 are contained in manufactured products, the devices 28 may be connected to associated programmable logic device integrated circuits 10. When the devices 28 are contained in finished goods containers, the devices 28 are generally packaged or unpackaged integrated circuit die and are not connected to other integrated circuits.

At step 150, the configuration data loading equipment 84 of FIG. 9 establishes a wireless link 24 with device 28. The link 24 may be unidirectional or bidirectional. In addressing the devices 28, unique codes may be used for addressing, manufacturer ID, and security purposes. A prefix or other suitable part of each code may be a common batch address that can be used to address 100s, 1000s, 10,000s or more devices 28 in parallel. The batch and/or unique addresses of the devices 28 may be used at step 150 (establishing the link) and at subsequent steps (e.g., during transmission of the configuration data).

At step 152, the configuration data loading equipment 84 wirelessly transmits the configuration data to the configuration device 28 over wireless path 24 and the received configuration data is stored in memory 118 (FIG. 10). If batch addressing is used, the configuration data may be transmitted to all of the configuration device integrated circuits 28 with the same batch address. With this approach, numerous configuration device integrated circuits 28 can be provided with configuration data in parallel. Memory 118 may be non-volatile memory, so that the configuration data is retained, even after the DC power provided by the power conversion circuitry 116 is no longer available.

At step 154, the configuration device programs the programmable logic device 10 by using loading circuitry 120 to load the configuration data from the configuration device's memory 118 to configuration memory 102 in programmable logic device 10 over path 124. Device 10 may be powered by DC power from power conversion circuitry 116 or by battery power or other suitable power supplied to programmable logic device 10 from another power source (e.g., a power source in product 92 of FIG. 10).

At step 156, the programmable logic device may transmit confirmation of successful programming to the configuration device. The transmission of the confirmation may be a user-adjustable option. Any suitable format may be used for the confirmation. For example, the confirmation may include a complete configuration read back that contains all programmed configuration data and/or may include error flag information.

If configuration device 28 is provided with configuration data wirelessly while configuration device 28 is in a finished goods container and is not connected to a programmable logic device, step 154 can take place following installation of device 28 in a product (e.g., upon powering up the product or at another suitable time). A typical installation arrangement for installing configuration device 28 in a product 92 is shown in FIG. 10.

If configuration device 28 is provided with configuration data wirelessly while configuration device 28 is in a manufactured product (e.g., the product 92 of FIG. 10), step 154 can take place upon powering up the product 92 or at another suitable time.

The foregoing is merely illustrative of the principles of this invention and various modifications can be made by those skilled in the art without departing from the scope and spirit of the invention.

What is claimed is:

1. A method for using configuration data loading equipment to wirelessly provide programmable logic device configuration data to an integrated circuit, wherein the integrated circuit is one of a plurality of integrated circuits that share a batch address, comprising:
    at the configuration data loading equipment, wirelessly transmitting the programmable logic device configuration data to the integrated circuit;
    at the integrated circuit, using power conversion circuitry to convert received radio-frequency (RF) signals into direct current (DC) power that powers receiver circuitry;
    at the integrated circuit, using the receiver circuitry powered by the power conversion circuitry to receive the wirelessly transmitted configuration data; and
    using the batch address to wirelessly transmit the configuration data to the plurality of integrated circuits in parallel.

2. The method defined in claim 1 further comprising:
    at the integrated circuit, loading the configuration data into programmable elements using power generated by the power conversion circuitry; and
    at the integrated circuit, using transmitter circuitry powered by the power conversion circuitry to transmit a confirmation to the configuration data loading equipment indicating that the configuration data has been loaded.

3. The method defined in claim 1, wherein the integrated circuit comprises a configuration device integrated circuit, the method further comprising storing the configuration data in non-volatile memory on the configuration device integrated circuit using power generated by the power conversion circuitry.

4. The method defined in claim 1, wherein the integrated circuit comprises a programmable logic device integrated circuit, the method further comprising using loading circuitry connected to the receiver circuitry to load the configuration data into configuration memory on the programmable logic device integrated circuit using power generated by the power conversion circuitry.

5. The method defined in claim 1 wherein the integrated circuit comprises first and second antennas, the method further comprising using the first antenna to provide the RF signals to the power conversion circuitry and using the second antenna to provide the wirelessly transmitted configuration data to the transceiver circuitry and to transmit a configuration confirmation through the transceiver circuitry.

6. The method defined in claim 1 wherein the integrated circuit contains only a single antenna, the method further comprising using the single antenna to provide the RF signals to the power conversion circuitry and using the single antenna to provide the wirelessly transmitted configuration data to the transceiver circuitry and to transmit a configuration confirmation through the transceiver circuitry.

7. The method defined in claim 1, wherein the integrated circuit comprises a configuration device integrated circuit, the method further comprising:
    using loading circuitry on the configuration device integrated circuit to load the configuration data into configuration memory on a programmable logic device integrated circuit over a wired communications path between the configuration device integrated circuit and the programmable logic device integrated circuit.

8. A method for using configuration data loading equipment to wirelessly provide programmable logic device configuration data to an integrated circuit, comprising:
    at the configuration data loading equipment, wirelessly transmitting the programmable logic device configuration data to the integrated circuit;
    at the integrated circuit, using power conversion circuitry to convert received radio-frequency (RF) signals into direct current (DC) power that powers receiver circuitry; and
    at the integrated circuit, using the receiver circuitry powered by the power conversion circuitry to receive the wirelessly transmitted configuration data, wherein the integrated circuit is contained in a finished goods container and wherein using the receiver circuitry powered by the power conversion circuitry to receive the wirelessly transmitted configuration data comprises using the receiver circuitry powered by the power conversion circuitry to receive the wirelessly transmitted configuration data while the integrated circuit is contained in the finished goods container.

9. The method defined in claim 1 wherein the integrated circuit is contained in a finished goods container, the method further comprising:
    using the power conversion circuitry to power transmitter circuitry in the integrated circuit while the integrated circuit is contained in the finished goods container;

at the integrated circuit in the finished goods container, loading the configuration data into programmable elements; and at the integrated circuit in the finished goods container, using the transmitter circuitry powered by the power conversion circuitry to transmit a confirmation to the configuration data loading equipment indicating that the configuration data has been loaded.

10. The method defined in claim 1 wherein the integrated circuit is contained in a manufactured product and wherein using the receiver circuitry powered by the power conversion circuitry to receive the wirelessly transmitted configuration data comprises using the receiver circuitry powered by the power conversion circuitry to receive the wirelessly transmitted configuration data while the integrated circuit is contained in the manufactured product.

11. A configuration device integrated circuit that loads configuration data into configuration memory in a programmable logic device integrated circuit that is separate from the configuration device integrated circuit, the configuration device integrated circuit comprising:

at least one antenna;

power conversion circuitry and transceiver circuitry connected to the antenna, wherein the power conversion circuitry converts radio-frequency (RF) signals received through the antenna into direct current (DC) power for the transceiver circuitry and wherein the transceiver circuitry receives wirelessly-transmitted configuration data;

memory in which the power conversion circuitry and transceiver circuitry store the wirelessly-transmitted configuration data, wherein the memory is powered by the power conversion circuitry; and loading circuitry that loads the configuration data from the memory into the configuration memory of the programmable logic device integrated circuit, wherein the transceiver transmits confirmation of successful loading of the configuration data through the antenna.

12. The configuration device integrated circuit defined in claim 11 wherein the at least one antenna comprises first and second antennas, wherein the first antenna is connected to the power conversion circuitry and the second antenna is connected to the transceiver circuitry.

13. The configuration device integrated circuit defined in claim 11 wherein the antenna comprises a single antenna connected to both the power conversion circuitry and the transceiver circuitry.

14. The configuration device integrated circuit defined in claim 11 wherein the antenna comprises a conductive spiral mounted on top of the configuration device integrated circuit.

15. The configuration device integrated circuit defined in claim 11 further comprising a backfill layer on the configuration device integrated circuit, wherein the antenna comprises a conductive spiral mounted on top of the backfill layer.

16. The programmable logic device integrated circuit defined in claim 11 further comprising a plurality of metal layers including a top metal layer and a second-to-top metal layer, wherein the at least one antenna is formed from metal in the top metal layer and the second-to-top metal layer.

* * * * *

UNITED STATES PATENT AND TRADEMARK OFFICE
CERTIFICATE OF CORRECTION

| | | |
|---|---|---|
| PATENT NO. | : 7,398,379 B1 | Page 1 of 1 |
| APPLICATION NO. | : 11/120575 | |
| DATED | : July 8, 2008 | |
| INVENTOR(S) | : Brian Yung Fun Wong et al. | |

It is certified that error appears in the above-identified patent and that said Letters Patent is hereby corrected as shown below:

In the drawings, Sheet 7, Fig. 9, the reference numeral 90 should be applied to the "ANTENNA(S)" that are part of programmable logic device 10.

Column 14, line 22, the text "to the transceiver circuitry" should be changed to --to transceiver circuitry--.

Column 14, lines 28 and 29, the text "to the transceiver circuitry" should be changed to --to transceiver circuitry--.

Signed and Sealed this
Nineteenth Day of July, 2011

David J. Kappos
*Director of the United States Patent and Trademark Office*